United States Patent [19]

Suzuki et al.

[11] Patent Number: 4,965,449

[45] Date of Patent: Oct. 23, 1990

[54] COLOR INFORMATION DETECTING DEVICE

[75] Inventors: Masao Suzuki; Ryosuke Miyamoto; Nobuo Fukushima; Takeshi Ogawa, all of Kanagawa, Japan

[73] Assignee: Canon Kabushiki Kaisha, Tokyo, Japan

[21] Appl. No.: 325,548

[22] Filed: Mar. 20, 1989

[30] Foreign Application Priority Data

Mar. 23, 1988 [JP] Japan ................................. 63-067179
Apr. 4, 1988 [JP] Japan ................................. 63-081296

[51] Int. Cl.⁵ ................................................. G01J 3/50
[52] U.S. Cl. ..................................... 250/226; 356/407
[58] Field of Search ................ 250/226; 356/405, 406, 356/407; 358/29, 41

[56] References Cited

U.S. PATENT DOCUMENTS 4,414,635 11/1983 Gast et al. ............................ 356/405
4,547,074 10/1985 Hinoda et al. ....................... 356/405
4,633,300 12/1986 Sakai ..................................... 358/41
4,646,161 2/1987 Tsuchiya et al. ..................... 358/41
4,823,185 4/1989 Miyamoto et al. ................. 250/226

Primary Examiner—David C. Nelms
Assistant Examiner—Stephone B. Allen
Attorney, Agent, or Firm—Robin, Blecker, Daley & Driscoll

[57] ABSTRACT

In a colorimetric sensor having a plurality of color sensors each of which is composed of a photo-electric conversion element for converting light into an electrical signal and a color filter added to the photo-electric conversion element for transmitting light of a specific wave length region, each of the color sensors is composed of a plurality of polygonally split pieces radially extending and spreading from a central part of the colorimetric sensor. A color sensor of a relatively low sensitivity has a greater number of split pieces than others. Among these color sensors, a color sensor having the lowest sensitivity has its split pieces either partially or totally disposed in a position covering two sides of an angular corner part of the colorimetric sensor.

15 Claims, 3 Drawing Sheets

COLOR INFORMATION DETECTING DEVICE

BACKGROUND OF THE INVENTION

1. Field of the Invention

This invention relates to a colorimetric sensor which is arranged to measure the color of light.

2. Description of the Related Art

FIG. 1 of the accompanying drawings shows the conventional colorimetric sensor for measuring the color of light. In FIG. 1, a part 1 represents the red sensor of a photo-electric conversion element which is provided with an R filter for photo-electric converting the red component of light. A part 2 represents the green sensor of a photo-electric conversion element which is provided with a G filter for photo-electric converting the green component of light. A part 3 represents the blue sensor of a photo-electric conversion element which is provided with a B filter for photo-electric converting the blue component of light. The colorimetric sensor which is arranged in this manner measures the color of an incident light by detecting the red, green and blue components of the light. Further, the color sensors are set in optimum sizes according to their sensitivity values. The blue sensor which has a lower sensitivity is arranged in a relatively large size. The red and green sensors which have a higher sensitivity are arranged in a relatively small size. For example, in the case of FIG. 1, the sizes of the red (R), green (G) and blue (B) sensors are set in the ratio of R : G : B = 1 : 1 : 2 as they are in the sensitivity ratio of R : G : B ≈ 1 : 1 : 1/2. FIG. 2 shows another example of the colorimetric sensor of the prior art which has been disclosed in U.S. Pat. No. 4,633,300. In this case, each of the color sensors is divided into a plurality of split pieces which are arranged to radially extend and spread from the center of the colorimetric sensor to the periphery thereof as shown in FIG. 2.

The colorimetric sensor of FIG. 1, however, has the following drawback: In case that a shadow arises, for example, at an upper right part which is as indicated by a broken line a-a' in FIG. 1, the quantity of light incident on the blue sensor 3 alone decreases. Then, in the output of the colorimetric sensor, the output of the blue sensor 3 alone decreases. As a result, the blue component is judged to be weaker than the actual intensity of the blue component of the incident light. Further, in the event of a shadow arising at an upper left part, the quantity of light incident on the red sensor 1 and the green sensor 2 deceases. Then, the outputs of the red and green sensors of the colorimetric sensor come to decrease. As a result, the red and green components are judged to be weaker than their actual intensity while the blue component is judged to be relatively stronger than its actual intensity.

The colorimetric sensor of FIG. 2 also has a similar drawback which is as follows: A shadow arising at a corner part causes an error of the output of the colorimetric sensor. When a shadow arises, for example, at an upper right part which is as indicated by a broken line a-a', the quantity of light incident on the blue and green sensors 3 and 2 decreases. The outputs of the blue and green sensors 3 and 2 of the colorimetric sensor then decrease. As a result, the red component of the incident light is misjudged to have a higher intensity than its actual intensity.

In cases where an uneven state arises in light due to a shadow or the like, some adverse effect of a corner part is conceivable in general. The colorimetric sensor of the prior art arranged as described above, however, produces an erroneous output when some part has no light while other parts have light due to a shadow formed on the colorimetric sensor.

SUMMARY OF THE INVENTION

This invention is directed to the solution of the above-stated problem of the prior art. It is therefore a principal object of the invention to provide a colorimetric sensor which is capable of minimizing any adverse effect of a shadow or a dark portion of light, so that its output can be produced without error even in the event of such a shadow or an uneven state of light.

To attain this object, a colorimetric sensor arranged according to the invention as an embodiment thereof comprises a plurality of color sensors. Each of the color sensors consists of a plurality of polygonally split pieces which are arranged to radially extend and spread from the central part of the colorimetric sensor. Among these color sensors, a color sensor of a relatively lower sensitivity than others is arranged to have a greater number of the split pieces than others. Further, a color sensor having the lowest sensitivity among the color sensors is arranged to have either a part or all of the split pieces thereof disposed in a position to cover two sides of each angular corner part of the colorimetric sensor.

The embodiment which is arranged in the manner as described above has the following advantage: Even when a shadow or the like comes to bring about an adverse effect beginning with an angular corner part, the output of the colorimetric sensor is not much affected thereby as each corner part has the color sensor which has a low sensitivity and occupies a narrow area of the corner part.

To attain the above-stated object, a colorimetric sensor which is another embodiment of the invention is arranged as follows: Each of color sensors consists of a plurality of polygonally split pieces which radially spread from the central part of the colorimetric sensor. In addition to that, the colorimetric sensor is arranged in a circular shape. The arrangement enables the colorimetric output level of the embodiment to fluctuate to a less degree by an uneven light. Another advantage of the embodiment resides in that: In cases where each color sensor is divided into a greater number of split pieces for an increased effect, the above-stated arrangement further enhances the desired effect of improvement.

The above and other objects and features of the invention will become apparent from the following detailed description thereof taken in connection with the accompanying drawings.

DETAILED DESCRIPTION OF THE PREFERRED EMBODIMENTS

Figure 1:
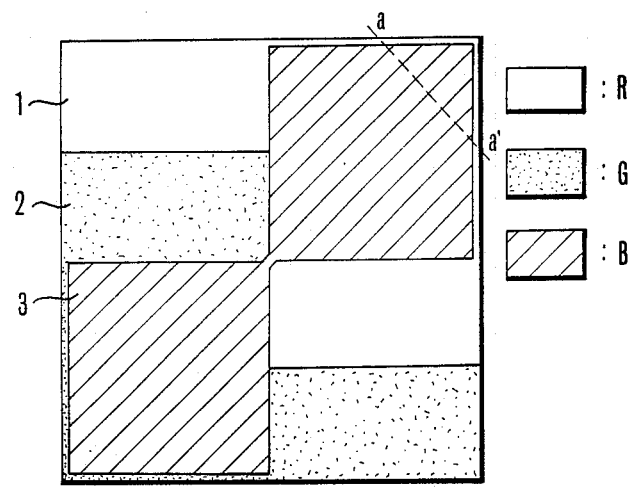
FIG. 1 shows the conventional colorimetric sensor arranged to measure the color of light.
Figure 2:
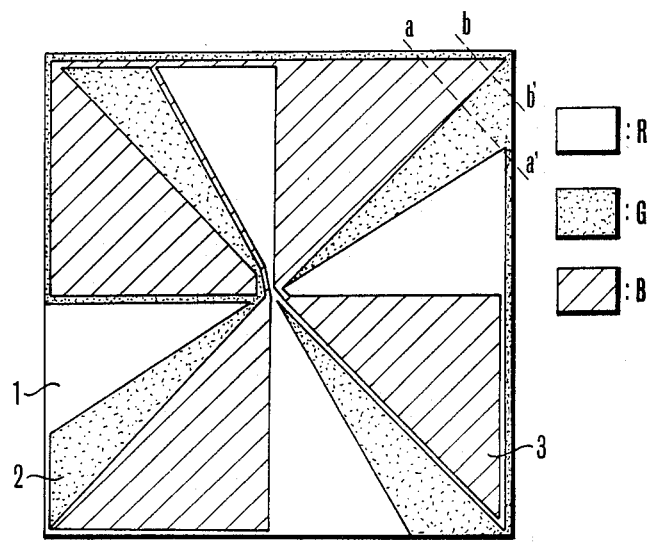
FIG. 2 shows by way of example the convention al arrangement wherein each color sensor is divided into a plurality of split pieces which radially spread from the central part toward the outside of the colorimetric sensor.
Figure 3:
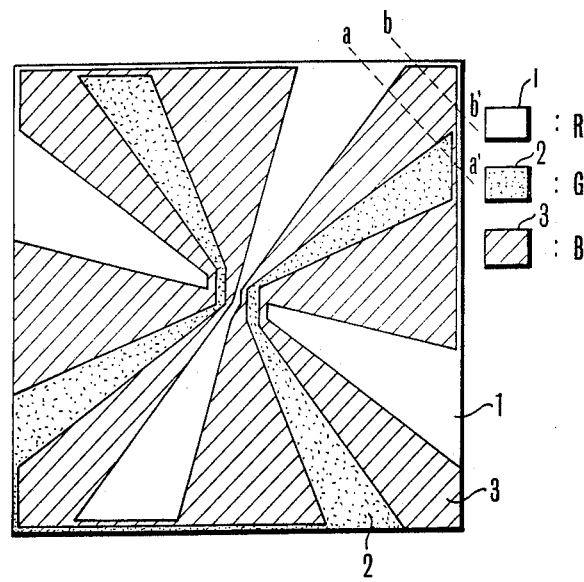
FIG. 3 shows a colorimetric sensor which is arranged according to this invention as a first embodiment thereof.

Referring to FIG. 3, the arrangement of a colorimetric sensor which is arranged as a first embodiment of the invention is as follows: A part 1 represents a red sensor part which consists of an R filter provided for transmitting the red component of an incident light and a first photo-electric conversion element. A part 2 represents a green sensor part which consists of a G filter provided for transmitting the green component of the incident light and a second photo-electric conversion element. A part 3 represents a blue sensor part which consists of a B filter provided for transmitting the blue component of the incident light and a third photo-electric conversion element.

In the arrangement described, if a shadow is brought about at any of angular corner parts of the embodiment, or, for example, at an upper right part as indicated by a broken line a-a', by an incident light, a shadow appears on each of the R (red), G (green) and B (blue) sensors. In the output of the colorimetric sensor, the levels of all the red, blue and green sensors drop in such a manner as to enable the arrangement to perform a correct color measuring operation.

As apparent from FIG. 3, the blue sensor which has a lower sensitivity and is provided with a larger area than others is divided in such a way as to have it partially arranged at angular corner parts. Meanwhile, the red and green sensors which are more vulnerable to the adverse effect of the shadow because of their higher sensitivity are arranged to have smaller portions of the shadow. Therefore, these color sensors evenly share the adverse effect of the shadow. This enables the embodiment to produce a colorimetric output without much error. Further, in a case where a shadow appears at the upper right part as indicated by another broken line b-b', the blue sensor which is of a low sensitivity is affected alone by the shadow. In this instance, compared with a case where other sensors having higher sensitivity is also affected by a shadow, the error for the same area having a dark portion of light (or shadowed area) becomes smaller.

Figure 4:
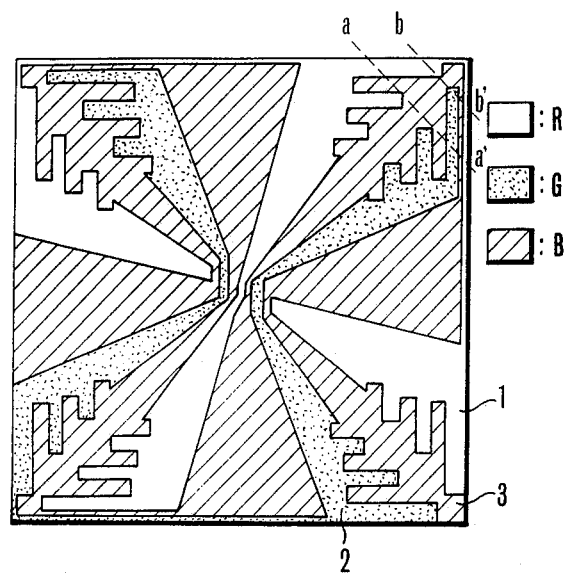
FIG. 4 shows a colorimetric sensor which is arranged as a second embodiment of the invention.

FIG. 4 shows the arrangement of a colorimetric sensor which is arranged also in accordance with this invention as a second embodiment thereof. Parts 1, 2 and 3 of FIG. 4 also represent the color sensors in the same manner as in FIG. 3.

In the case of the second embodiment shown in FIG. 4, the blue sensor is arranged to have a zigzag shape at the corner parts. This shape enables the output of the colorimetric sensor to be affected to a less degree by a shadow appearing at the corner parts. When an uneven (darkened) light portion appears at the upper right part as shown in FIG. 4, for example, it is not only the blue sensor that is affected by the darkened light but other color sensors including the red and green sensors are also affected in such a way as to bring about almost no change in the output of the colorimetric sensor.

Further, in respect to the color sensor dividing arrangement, the red and green sensors are divided into four equal parts respectively while the blue sensor is divided into eight equal parts in the cases of FIGS. 3 and 4. The error due to a shadow or the like can be further lessened by increasing the color sensor dividing number.

In the cases of the first and second embodiments of the invention described above, the color sensor which has a lower sensitivity than other color sensors is divided or split into a greater number of split pieces than others. In addition to that, a part of or the whole of the low sensitivity color sensor is disposed in a position to cover the two sides of each angular corner part. This arrangement reduces the adverse effect of a dark portion of light such as a shadow or the like even when it arises on the colorimetric sensor. The color of an incident light thus can be accurately measured to give a reliable colorimetric output.

Figure 5:
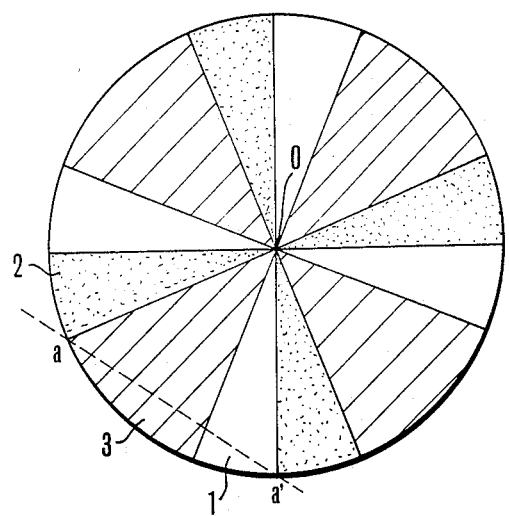
FIG. 5 shows a colorimetric sensor which is arranged as a third embodiment of the invention.

FIG. 5 shows a colorimetric sensor which is arranged according to this invention as a third embodiment thereof. Compared with the conventional sensors, the third embodiment also reduces the level of output fluctuations resulting from a dark portion of light such as a shadow arising, for example, at a lower left part which is indicated by a line a-a'. More specifically, the maximum value of an area $\Delta S$ (shadowed area) irradiated with a dark portion of light applied to the parts of the blue and red sensors 3 and 1 is 0.0404 times as much as the total area S of the colorimetric sensor. In other words, with the radius of the colorimetric sensor assumed to be "1" and the total area S to be expressed as $S = \pi \cdot 1^2 = \pi$, the maximum value $\Delta S_{max}$ of the area $\Delta S$ can be expressed from $$\Delta S_{max} = \text{sector oaa} - \text{triangle oaa'} \text{ as}$$

$$\Delta S_{max} = \pi \cdot 1^2 \cdot 3/16 - (1 \cdot \sin 3\pi/16)$$
$$\times (1 \cdot \cos 3\pi/16) \times \tfrac{1}{2} \times 2 \approx 0.127$$

Therefore, a ratio between the total area S and the maximum value $\Delta S_{max}$ of the area $\Delta S$ is expressed as follows:

$$\Delta S_{max} / S \approx 0.127 / \pi \approx 0.040$$

This clearly indicates that the smallness of the maximum value $\Delta S_{max}$ of the shadowed area $\Delta S$ relative to the total area S enables the embodiment to be less affected by the unevenly darkened light than the conventional colorimetric sensor.

Figure 6:
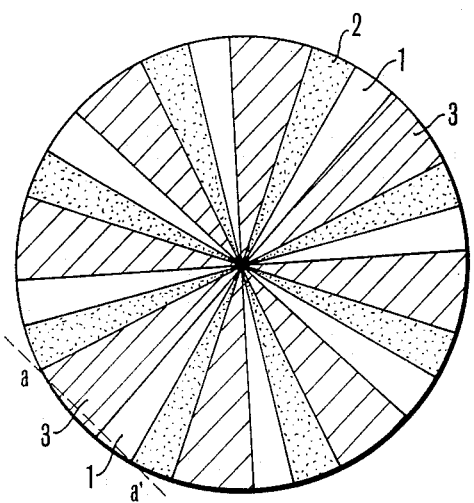
FIG. 6 shows a colorimetric sensor which is arranged as a fourth embodiment of the invention.

FIG. 6 shows a colorimetric sensor arranged as a fourth embodiment of the invention.

In the case of the fourth embodiment, each of the color sensors is divided into twice as many split pieces as in the case of FIG. 5. In other words, each of the red sensor 1, the green sensor 2 and the blue sensor 3 is divided into eight parts. Therefore, each split piece has a smaller area than in the case of the third embodiment. The use of the smaller split pieces further reduces the fluctuations of the output of the colorimetric sensor due to the adverse effect of an uneven light.

More specifically, when an uneven light incident upon the whole colorimetric sensor area S shadows a part having only the blue sensor 3 and the red sensor 1 (lower left part as indicated by a line a-a'), the ratio of the maximum value of the shadowed area $\Delta S$ to the whole or total colorimetric sensor area S becomes 0.005. In other words, with the radius assumed to be "1" and the total area S to be $S = \pi$, the maximum shadowed area $\Delta S_{max}$ can be expressed as follows:

$$\Delta S_{max} = \pi \cdot 1^2 \cdot 3/32 - (1 \cdot \sin 3\pi/32)$$
$$\times (1 \cdot \cos 3\pi/32) \times \tfrac{1}{2} \times 2 \approx 0.0166$$

$$\Delta S_{max} / S \approx 0.005$$

The fourth embodiment thus gives a still greater advantageous effect than the third embodiment.

As described in the foregoing, in the cases of the third and fourth embodiments of the invention, the colorimetric sensors are arranged in a circular shape. The circular shape reduces the fluctuations of the output of the colorimetric sensor due to an uneven light such as light including a shadow. Therefore, they are capable of correctly measuring the color of light to give an accurate output of the colorimetric sensor.

Further, the circular shape further enhances the improvement attainable by increasing the color sensor dividing number in reducing the fluctuations of the output of the colorimetric sensor caused by an uneven light.

What is claimed is:

1. A color information detecting device having a plurality of color sensors each of which is composed of a photo-electric conversion element for converting light of a specific wave length region wherein each of said plurality of color sensors is composed of a plurality of polygonally split pieces which radially extend and spread from a substantially central part of said color information detecting device and wherein, among said plurality of color sensors, a color sensor which has a relatively low sensitivity is arranged to have a greater number of said split pieces than other color sensors.

2. A device according to claim 1, wherein part or all of split pieces of a color sensor having the lowest sensitivity among said plurality of color sensors is disposed in a position covering said sides of an angular corner part of said color information detecting device.

3. A device according to claim 1, wherein said color sensor which is disposed at the angular corner part or in the position covering two sides of said color information detecting device is arranged in a polygonal shape which has at least one sawtooth-like projection on each side thereof.

4. A device according to claim 1, wherein the color sensors include a color sensor for detecting a green color.

5. A color information detecting device having a plurality of color sensors each of which is composed of a photo-electric conversion element for converting light of a specific wave length region into an electrical signal, wherein each of said plurality of color sensors is composed of a plurality of polygonally split pieces which radially extend and spread from a substantially central part of said color information detecting device, and wherein said color information detecting device is formed in a circular shape.

6. A device according to claim 1 or 5, wherein the plurality of color sensors include a color sensor for detecting a red color and a color sensor for detecting a blue color.

7. A device according to claim 1 or 5, wherein the respective color sensors are formed in a rotation symmetric shape around a common point.

8. A colorimetric sensor including a plurality of color sensors which extend in radial shape from a predetermined point and detect different specific wave length ranges of light, respectively, wherein the number of the color sensors which detect the light of the wave length range corresponding to relatively low sensitivity is larger than the number of the color sensors which detect the light of the other wave length range and the color sensor of the relatively low sensitivity is arranged between said color sensors which detect the light of the other wave length range.

9. A colorimetric sensor according to claim 8, wherein the lights of the specific wave length range include red, green and blue colors.

10. A colorimetric sensor according to claim 8, wherein the predetermined point resides at substantially central part of said colorimetric sensor.

11. A colorimetric sensor according to claim 8, wherein the respective color sensors are formed in a rotation symmetric shape around said predetermined point.

12. A colorimetric sensor including a plurality of color sensors which extend in a radial shape from a predetermined point and detect lights of different specific wave length ranges, wherein the color sensors for detecting the lights of the wave length ranges corresponding to the relatively low sensitivity and the other color sensors are arranged in alternate fashion.

13. A colorimetric sensors according to claim 12, wherein the lights of the specific wave length range include red, green and blue colors.

14. A colorimetric sensor according to claim 12, wherein the predetermined point resides at substantially central part of said colorimetric sensor.

15. A colorimetric sensor according to claim 12, wherein the respective color sensors are formed in a rotation symmetric shape around said predetermined point.

* * * * *